Figure 1:
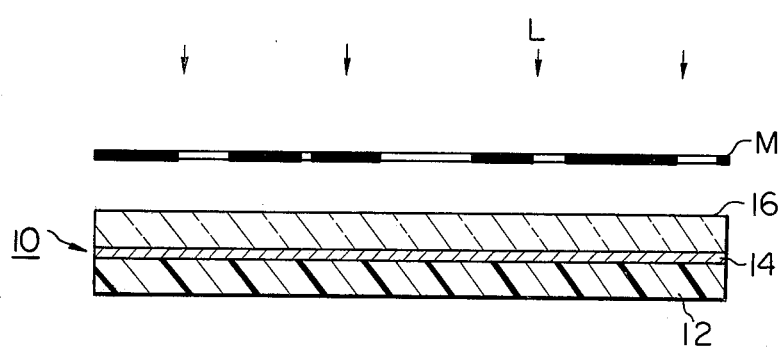

United States Patent [19]

Moriya et al.

[11] 4,205,989
[45] Jun. 3, 1980

[54] DRY SYSTEM IMAGE PRODUCING ELEMENT

[75] Inventors: Takeo Moriya, Kawagoe; Toshio Yamagata, Urawa, both of Japan

[73] Assignee: Kimoto & Co., Ltd., Tokyo, Japan

[21] Appl. No.: 934,478

[22] Filed: Aug. 17, 1978

Related U.S. Application Data

[63] Continuation of Ser. No. 704,917, Jul. 13, 1976, abandoned.

[30] Foreign Application Priority Data

Apr. 14, 1976 [JP] Japan ..................... 51-42083

[51] Int. Cl.² .................. G03C 5/00; G03C 1/52; G03C 1/74; G03C 5/18
[52] U.S. Cl. ..................... 430/306; 430/167; 430/253; 430/256; 430/302; 430/323; 430/319; 430/338; 430/524; 430/526; 430/627; 430/494; 430/78
[58] Field of Search ............ 96/75, 91 R, 86 R, 86 P, 96/87 R, 33, 67, 68, 28, 35, 36.2, 36

[56] References Cited

U.S. PATENT DOCUMENTS

| | | | |
|---|---|---|---|
| 2,560,137 | 7/1951 | Slifkin | 96/75 |
| 2,729,562 | 1/1956 | Zemp | 96/75 |
| 2,772,160 | 11/1956 | Hepher | 96/91 R |
| 2,810,342 | 10/1957 | Neugebauer | 96/33 |
| 2,871,119 | 1/1959 | Weegar et al. | 96/75 |
| 3,143,418 | 8/1964 | Priest et al. | 96/75 |
| 3,744,904 | 7/1973 | Loprest et al. | 96/67 |
| 3,748,137 | 7/1973 | Worth et al. | 96/67 |
| 3,778,270 | 12/1973 | Roos | 96/91 R |
| 4,002,478 | 1/1977 | Kokawa et al. | 96/68 |
| 4,008,084 | 2/1977 | Ikeda et al. | 96/86 P |
| 4,050,936 | 9/1977 | Takeda et al. | 96/68 |
| 4,081,282 | 3/1978 | Merrill et al. | 96/67 |
| 4,120,722 | 10/1978 | Okamoto et al. | 96/86 P |

FOREIGN PATENT DOCUMENTS

| | | |
|---|---|---|
| 1063559 | 3/1967 | United Kingdom . |
| 1090663 | 11/1967 | United Kingdom . |
| 1148362 | 4/1969 | United Kingdom . |
| 1151532 | 5/1969 | United Kingdom . |
| 1215749 | 12/1970 | United Kingdom . |

OTHER PUBLICATIONS

Kirk, R. et al., "Encyclopedia of Chemical Technology," vol. 3, pp. 368, 374–375.
Chemical Abstracts, vol. 77, Abstract #95357y, 1972.
Chemical Abstracts, vol. 79, Abstract #99201g, 1973.
Chemical Abstracts, vol. 87, Abstract #192126m, 1977.
Chemical Abstracts, vol. 88, Abstract #30394r, 1978.
Dinaburg, M., "Photosensitive Diazo Compounds," 1964, The Focal Press, pp. 68–70, and 120–123.
Kosar, J., "Light-Sensitive Systems," 1965, J. Wiley & Sons, pp. 258–267.

*Primary Examiner*—Charles L. Bowers, Jr.
*Attorney, Agent, or Firm*—Frishauf, Holtz, Goodman & Woodward

[57] ABSTRACT

There is disclosed a dry system image producing element comprising a substrate, a thin metal layer and a photosensitive layer. After exposing the element to light through a desired pattern, the photosensitive layer is peeled off to obtain a light barrier pattern made from the metal on the substrate corresponding to the photosensitized portion.

18 Claims, 2 Drawing Figures

U.S. Patent    Jun. 3, 1980    4,205,989

DRY SYSTEM IMAGE PRODUCING ELEMENT

This is a continuation, of application Ser. No. 704,917, filed July 13, 1976, now abandoned.

This invention relates to a dry system image producing element and a process for producing an image made from a thin metal or metal compound layer, said layer having been deposited on a substrate. In more particular, this invention relates to such element comprising a substrate, a thin layer of a metal or a metal compound and a photosensitive layer containing a photosensitizer and a polymeric binding material, said photosensitive layer being capable of decreasing the interfacial adhesion between said metal or metal compound layer and said photosensitive layer upon exposure to light, and to a process for producing an image made from a metal or metal compound layer wherein such image producing element is exposed to light through a pattern and the photosensitive layer is peeled off to obtain an image or pattern made from the metal or metal compound layer on the substrate corresponding to the photosensitized portion.

Various processes have already been proposed for producing an image on a substrate, for example, (1) by exposing to light an element comprising a substrate and a photosensitive coating containing a photosensitizer such as a silver halide, a photosensitive polymer or a photopolymerisable monomer, or (2) by exposing to light an element comprising a photoconductive layer and effecting toner development. However, such prior art involves inherent disadvantages: For example, where a silver halide is used, development, fixing, washed with water and drying are required; where a photosensitve polymer or a photopolymerisable monomer is used, development, etching and drying are required; and where a photoconductive material is used, activation, use of toner and fixing by heat are required. Thus, with the prior art it is necessary to use special chemical treatment and/or apparatus with resulting high cost and environmental pollution caused by chemicals.

Accordingly, an object of this invention is to provide a dry system image producing element which avoids the abovementioned defects.

Another object is to provide an image producing element which possesses a high $\gamma$-value, high contrast and good resolving power and which can produce an image having improved light barrier effect.

Still another object is to provide an image producing element which can provide an electroconductive pattern on a substrate.

The dry system image producing element according to this invention comprises a tough substrate having a smooth surface, a thin layer of a metal or a metal compound (hereinafter referred to as the "metal layer") and a photosensitive layer containing a polymeric binding material which is a film forming material and a benzophenone, quinone compound, diazonium compound or azido compound photosensitizer, said photosensitive layer being capable of decreasing the interfacial adhesion between the metal layer and the photosensitive layer upon exposure to light. Thus, when the element according to this invention is exposed to light through a mask having a desired pattern, the interfacial adhesion between the metal layer and the photosensitized portion of the photosensitive layer decreases, but such adhesion in respect of the non-photosensitized portion does not change. Then, when the photosensitive layer is peeled off, a metal pattern corresponding to the photosensitized portion remains on the substrate but the non-photosensitized portion of the metal layer is removed. In this connection, it is essential that the adhesion of the binding material to the metal layer be higher than that of the metal layer to the substrate.

The substrate which may be employed according to this invention includes a variety of materials capable of accepting a thin metal layer thereon, such as a film forming thermoplastic polymeric material, glass or metal. Examples of the thermoplastic material are various synthetic resins, for example, a polyester such as polyethylene terephthalate, a polycarbonate, a polyolefin such as polypropylene, polyvinyl chloride, polystyrene, polymethyl methacrylate and a copolymer thereof and cellulose derivatives, for example, diacetylcellulose, triacetylcellulose, propylcellulose and a mixed cellulose ester. Other sheet-like materials such as paper, woven fabric and non-woven fabric which have been coated with the above-mentioned film forming material may also be used.

The substrate material may be incorporated with various additives, such as pigment, dyestuff and filler may be incorporated in the substrate material to give a writing property, opacity and coloration.

The thin metal layer on the surface of the substrate may be produced by, for example, vacuum plating such as vacuum evaporation and cathodic spattering, electroless plating or a combination of electrolytic plating therewith. The thickness of the metal layer is preferably more than 10 m$\mu$. A thinner layer does not effectively have sufficient light barrier effect, so the image produced on the substrate is hardly visible. Although the upper limit of the thickness is not critical, in general, a thickness of up to 1000 m$\mu$ preferably from 20 to 500 m$\mu$ is used. For special usage as a printed circuit, a metal layer of more than 1000 m$\mu$ in thickness may be successfully used.

Among various metals suitable for evaporation plating, aluminum and zinc are most preferred; but next preferred metals are silver, gold and nickel, but other metals, such as chromium, cobalt, iron, germanium, magnesium, manganese, platinum and tin may also be exemplified. Cadmium sulfide, magnesium fluoride and titanium dioxide are metal componds suitable for vacuum plating.

Electroless plating may be carried out in a conventional way by subjecting the substrate to sensitizing and activation treatments, followed by immersing it in an aqueous solution containing metal salt and a reducing agent to deposit a metal layer on the substrate. For this purpose, copper, nickel, cobalt, gold, palladium, silver and nickel-cobalt and nickel-phosphorus alloys are suitable.

In general, the vacuum evaporation process is preferable to electrolytic or electroless plating because with it a wide range of metals can be used; the operation is conducted in a simple way at high speed and little or no waste material is produced.

The photosensitive layer comprises a polymeric binding material and a photosensitizer. Since the layer is peeled off from the substrate after printing exposure treatment, it is important that the binding material possesses a good film forming property and has high film strength; further, the material is preferably non-blocking in order that a stack of elements does not cause blocking with each other during handling and storage.

Examples of the binding material which may be used according to this invention include various synthetic resins, for example, polyvinyl chloride, vinyl chloride/vinyl acetate copolymer, vinyl chloride/vinylidene chloride copolymer, vinyl chloride/vinyl acetate/maleic anhydride, acrylonitrile or vinyl alcohol terpolymer, vinyl chloride/vinylidine chloride/acrylonitrile terpolymer, vinyl acetate or methyl methacrylate terpolymer, an acrylic ester/methyl methacrylate or styrene copolymer, a thermoplastic polyester or copolyester such as polyethylene terephthalate and ethylene terephthalate/isophthalate copolymer, an alcohol soluble polyamide, a polyurethane, polybutyral and polyvinyl alcohol; cellulose derivatives such as acetylcellulose, acetyl-butylcellulose, nitrocellulose and ethylcellulose; and rubber derivatives such as cyclized rubber and rubber chloride. These polymeric materials may be used alone or in any combination.

In general, the binding material is used in the form of a solution in an appropriate organic solvent, example of which are, for example, methyl ethyl ketone, toluene, cyclohexanol, methanol, ethanol, i-propanol, methyl cellosolve, ethyl cellosolve and cellosolve acetate.

In selecting the solvent, caution should be taken to insure that the solvent is capable of dissolving the photosensitizer employed but does not dissolve or swell the substrate material.

When the binding material is polyvinyl alcohol, an aqueous solution thereof is also adequate. Polyvinyl chloride and polyurethane may also be used in the form of an emulsion or a dispersion.

The photosensitizers which may be used according to this invention are classified and exemplified as follows:
 (a) Benzophenone
 (b) Quinone compounds:
  1,4-Naphthoquinone, 2-methyl-1,4-naphthoquinone, anthraquinone, 2-methylanthraquinone, 2-ethylanthraquinone, 2-chloroanthraquinone and p-toluquinone, especially the former two being preferred.
 (c) Diazonium compounds:
  4-(p-Tolyl mercapto)-2,5-diethoxybenzene diazonium zinc chloride, sodium sulfate or tetrafluoroborate,
  4-(p-tolyl mercapto)-2,5-dimethoxybenzene diazonium zinc chloride,
  4-(p-methyl benzoylamino)-2,5-diethoxybenzene diazonium zinc chloride,
  4-(p-methoxybenzoylamino)-2,5-diethoxybenzene diazonium zinc chloride,
  4-morpholino-2,5-butoxybenzene diazonium zinc chloride or tetrafluoroborate,
  4-morpholinobenzene diazonium tetrafluoroborate,
  4-pyrrolidino-3-methylbenzene diazonium tetrafluoroborate,
  p-N,N-dimethyl aminobenzene diazonium zinc chloride,
  p-N,N-diethyl aminobenzene diazonium zinc chloride or tetrafluoroborate,
  p-N-ethyl-N-hydroxy aminobenzene diazonium zinc chloride, 1,2-diazonaphthol-5-sulfonic acid sodium salt, and
  zinc chloride salt in a condensate of 4-diazodiphenylamine sulfuric acid and formaldehyde.
 (d) Azido compound:
  2,6-Di(4'-azido benzal)cyclohexanone.

According to this invention, it is important to select an appropriate combination of the photosensitizer and the binding material, in order to sufficiently decrease the interfacial adhesion of the metal layer and photosensitized portion of photosensitive layer, upon exposure the element to light.

For the benzophenone and the quinone compounds, preferred binding materials are polyvinyl chloride, vinyl chloride/vinyl acetate copolymer, vinyl chloride/vinyl acetate/maleic anhydride, acrylonitrile or vinyl alcohol terpolymer, vinyl chloride/vinylidene chloride copolymer, vinyl chloride/vinylidene chloride/acrylonitrile terpolymer and nitrocellulose, since these materials can produce a high quality image. A cellulose derivative and a rubber derivative may also be used, for example, acetylcellulose, acetyl-butylcellulose, ethylcellulose, cyclized rubber and rubber chloride.

For the diazonium and azido compounds, polyvinyl butyral is suitable in addition to the polymeric materials mentioned in connection with the benzophenone and the quinone compounds. Further, a thermoplastic polyester and copolyester, an alcohol soluble polyamide, polyvinyl alcohol, acrylic ester/methyl methacrylate or styrene copolymer, polyurethane emulsion and polyvinyl chloride emulsion may also be used.

The amount of photosensitizer to be used on the basis of the binding material is from 1 to 20%, preferably 5 to 10% by weight in case of the benzophenone or the quinone compound, and from 0.1 to 10% preferably 1 to 6% by weight in case of the diazonium or azido compound. A large amount of the photosensitizer causes coloration of the photosensitive layer which decreases the photosensitivity.

A solvent solution, an aqueous solution or an emulsion containing the photosensitizer and the binding material may be applied to the metal layer on the substrate by any conventional coating technique including conveniently reverse, gravier and kiss roll coating. The solid content of such coating material may vary depending upon coating process employed and the amount to be applied and is in general from 5 to 30% by weight. The coating material is applied in such an amount that the dried photosensitive layer is from 0.5 to 100µ and preferably 2 to 20µ in thickness.

Any dyestuff and pigment may be incorporated in the coating material so far as they do not adversely affect the transparency and the photosensitizing mechanism of the resulting photosensitive layer. In particular, a body pigment may conveniently be added thereby producing a mat layer which gives a drawing ink and printing ink acceptable surface. Thus, the final product is readily written by hand or typewriter to give a desired pattern which is reproduced as a metal image on the substrate upon exposure of the element to light. If desired, the element according to this invention may be provided with a supporting layer on the photosensitive layer in order to improve the mechanical strength of the layer to be peeled off. Thus, it is preferred to use a transparent material such as a film made of a thermoplastic polyester, polypropylene, a polyamide, polyvinyl chloride or a cellulose ester, transparent paper or synthetic resin saturated paper.

The image producing element according to invention is exposed to light through a desired pattern and the photosensitive layer is peeled off, then an image made of the metal corresponding to the photosensitized portion is produced on the substrate. As the light source, one emitting ultraviolet to visible light of short wave length is employed; for example, a carbon arc lamp, a high pressure mercury arc lamp or a fluorescent argon lamp is preferred, but a tungsten lamp, a xenon arc lamp, a mercury arc lamp or a metal halide arc lamp may also be used. The cheapest light source is of course sunlight. The period for which the image producing element is exposed to light varies depending upon the type of photosensitive layer, the wave length emitted from the light source and the distance from the light source. It has been found that, for example, 30 seconds is a satisfactory exposure time for a 3.0 KW carbon arc lamp at a distance of 80 cm.

Figure 2:
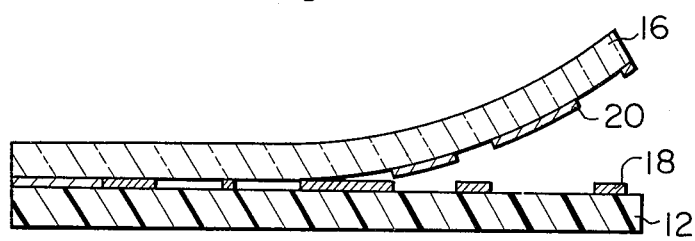

This invention will be explained referring to the accompanying drawings, in which FIG. 1 illustrates a cross-sectional view of the image producing element according to this invention and FIG. 2 illustrates the state of the photosensitive layer being peeled off after exposure to the light to obtain an image or a pattern of the metal on the substrate.

In FIG. 1, the image producing element 10 comprises a substrate 12, a metal layer 14 and a photosensitive layer 16 containing a photosensitizer and a polymeric binding material. The element is exposed to the light L through a mask M having a desired negative pattern whereby the interfacial adhesion between the photosensitized portion and the metal layer is decreased. Thus, upon peeling off the layer, there are produced a metal pattern 18 on the substrate corresponding to the photosensitized portion and a metal pattern 20 on the photosensitive layer corresponding to the non-photosensitized portion; in other words a positive pattern is on the substrate and a negative pattern on the photosensitive layer.

The metal pattern on the substrate thus produced is used for a wide variety of usages such as an intermediate or secondary original, a lithographic plate, a process film, a printed circuit, an original copy for display and projection, an electrode for electroluminescence and a label.

It has also been found that the loss in the interfacial adhesion between the photosensitized portion and the metal layer is recovered, when the photosensitized element is subjected to a heat treatment. Therefore, it is possible, after heating an image producing element which has been exposed to light in a desired pattern, to expose the overall photosensitive layer to light again, followed by peeling off the photosensitive layer to produce a reverse pattern made from the metal layer on the substrate corresponding to the initially non-photosensitized portion.

Caution should be taken that the heating temperature and the heating time are not such as to decompose the unexpected photosensitizer too much.

According to this invention, therefore, it is possible to select either a negative-positive process or a positive-positive process to produce a desired metal pattern on the substrate.

This invention has been explained specifically referring to a sheet-like element, however, it should be understood that a dry system image producing element is also fabricated in any of complicated three dimensional shape by, for example, the following steps:
 (a) depositing a thin metal layer on a three dimensional body,
 (b) coating a photosensitive composition on the metal layer and drying it to obtain a photosensitive layer, and
 (c) writing a desired light shielding pattern, for example, in black ink, on the photosensitive layer.

The element thus obtained is exposed to light, followed by peeling off the photosensitive layer; there is obtained a light barrier metal pattern on the three dimensional body. The product is especially suitable for display and electroluminescence purposes.

This invention will be explained in detail by means of Examples. However, it should be understood that this invention is in no way limited to these Examples. In the Examples, percentage is given by weight.

EXAMPLE 1

Twenty grams of a copolymer of 86% of vinyl chloride, 13% of vinyl acetate and 1% of maleic anhydride available from Union Carbide Corporation, New York, N.Y., U.S.A. under the name of "Vinylite VMCH" and 0.8 g of 4-(p-tolyl mercapto)-2,5-diethoxy benzene diazonium zinc chloride available from Kabushiki Kaisha Daito Kogyosho, Tokyo, Japan under the name of "WH-1500" were dissolved in 80 g of methyl ethyl ketone to obtain a photosensitive composition containing 20.63% of solid material.

On the surface of a 100$\mu$ polyethylene terephthate film was deposited by vacuum evaporation a 100m$\mu$ aluminum layer, to which the photosensitive composition was coated by a wire bar and dried at 90° C. into 5$\mu$ photosensitive layer to obtain an image producing element.

A negative original was positioned on the photosensitive layer and the assembly was exposed to light from a carbon arc lamp at a distance of 80 cm for 30 seconds. Upon peeling off immediately the photosensitive layer, there were obtained a sharp negative aluminum pattern on the polyester film and a positive pattern on the photosensitive layer.

The negative pattern had a resolving power of 72/mm, a transmission density of 3.5, high contrast of $\gamma$ value being 20 and good dot reproducibility. The product was suitable for use as a process film.

EXAMPLE 2

A photosensitive composition was prepared following to the procedures of Example 1, excepting that 0.8 g of 4-(p-methoxy benzoylamino)-2,5-diethoxybenzene diazonium zinc chloride was used.

On the surface of a 12$\mu$ polyethylene terephthalate film was deposited by vacuum evaporation a 80 m$\mu$ zinc layer, on which the photosensitive composition was coated by a wire bar and dried at 90° C. for one minute into a 9$\mu$ layer.

The element thus produced was exposed to light as in Example 1 to obtain a sharp negative zinc pattern on the substrate and a positive pattern on the photosensitive layer.

EXAMPLE 3

Twenty grams of a copolymer as used in Example 1 and 2.0 g of 1,4-naphthoquinone were dissolved in a mixture of 40.0 g of methyl ethyl ketone, 35 g of toluene and 5 g of cyclohexanone to prepare a 21.57% photosensitive composition.

On the surface of a 75$\mu$ diacetylcellulose film was deposited by vacuum evaporation a 50 m$\mu$ aluminum layer on which the photosensitive composition was coated by a wire bar and dried at 90° C. for 2 minutes to obtain a 10$\mu$ layer.

A positive original was positioned on the photosensitive layer and the assembly was exposed to light using an electrographic machine of Ricopy SM 1500 (available from Ricoh Co., Ltd., Tokyo, Japan) provided with a 1500 W mercury arc lamp at printing exposure of a dial figure of 10. After the photosensitive layer was peeled off, a sharp negative aluminum pattern was obtained on the substrate.

EXAMPLE 4

Twenty grams of a copolymer of 87% vinyl chloride and 13% vinyl acetate available from Union Carbide Corporation under the name of "Vinylite VYHH" and 0.8 g of 4-(p-tolyl mercapto)-2,5-diethoxybenzene diazonium zinc chloride were dissolved in a mixture of 40 g of methyl ethyl ketone and 40 g of toluene to prepare a 20.63% photosensitive composition.

The photosensitive composition was coated by a wire bar on a 50 m$\mu$ silver layer deposited on a glass plate and dried by hot air at 90° C. for 2 minutes to obtain a 9$\mu$ photosensitive layer.

According to procedures similar to those of Example 1, the element thus obtained was exposed to light through a positive original, then a negative silver pattern was obtained on the glass plate after peeling off the photosensitive layer.

EXAMPLE 5

A polyethylene terephthalate film having a thickness of 100$\mu$ was immersed in the following sensitizing bath for 3 minutes and thoroughly washed with water, then immersed in the following activating bath for 3 minutes and washed with running water thoroughly, and immersed in the following plating bath for 2 minutes to obtain a nickel-phosphorus alloy layer of 50 m$\mu$ thick:

Sensitizing bath
$SnCl_2$—10 g
HCl—40 ml
$H_2O$—1000 ml
Temperature—25° C.
Activating bath
$PdCl_3$—0.5 g
HCl—5 ml
$H_2O$—1000 ml
Temperature—23° C.
Plating bath
$NiSO_4$—40 g
Sodium citrate—24 g
Sodium hypophosphite—20 g
Sodium acetate—14 g
Ammonia chloride—5 g
$H_2O$—to make 100 ml The photosensitive composition prepared in Example 2 was coated onto the alloy layer. The element thus produced was exposed to light using a positive original with the machine of Example 3 at a dial figure of 5. A sharp negative alloy pattern was obtained on the polyester film upon peeling off the photosensitive layer.

EXAMPLE 6

Twenty grams of a copolymer as in Example 1 and 2 g of benzophenone was dissolved in 80 g of methyl ethyl ketone to prepare a photosensitive composition.

On one side of a 100 m$\mu$ polyethylene terephthalate film was deposited a 100 m$\mu$ aluminum layer by vacuum evaporation. Another side was coated with a mixture of 10 g of yellow fluorescent pigment, 5 g of a linear polyester resin, 38 ml of methyl ethyl ketone and 15 ml of cyclohexanone and dried to obtain a 10 $\mu$ yellow coating.

The photosensitive composition was coated by a wire bar onto the aluminum layer and dried as in Example 2.

A positive original was disposed on the coating and exposed to light with the machine used in Example 3 at a dial figure of 2.

After peeling off the coating, a negative aluminum pattern in silver was obtained on a film which emitted a yellow fluorescence. Thus, the product was suitable for advertisement.

EXAMPLE 7

A 400 m$\mu$ aluminum layer was deposited by vacuum evaporation on one side of a 188$\mu$ polyethylene terephthalate film, and then coated with a photosensitive composition prepared as in Example 1.

A negative white screen having a screen ruling of 300 per inch was overlaid on the photosensitive layer and the assembly was exposed to light with a pneumatic printer provided with a 3 KW carbon arc lamp at a distance of 80 cm for 30 seconds. Then, the photosensitive layer was peeled off to obtain a positive aluminum screen deposited on the film.

The product was suitable for use as a transparent electrode of a flexible electro luminescence sheet.

EXAMPLE 8

A 20.75% photosensitive composition was prepared by mixing 20 g of a copolymer as used in Example 1, 1 g of 2,6-di(4'-azidobenzal) cyclohexanone, 40 g of methyl ethyl ketone and 40 g of toluene. On one side of a 100$\mu$ polyethylene terephthalate film was deposited by vacuum evaporation a 100 m$\mu$ aluminum layer, to which the photosensitive composition was coated and dried at 90° C. for one minute to obtain a 4$\mu$ coating.

A solution of 15 g of acetyl-butylcellulose in 60 g of toluene and 25 g of methanol was overcoated and dried at 90° C. for two minutes to give a 15$\mu$ reinforcement.

The product was exposed to light together with a positive original using the machine employed in Example 3 at a dial figure of 1.5. After peeling off the coated layers, a negative aluminum pattern was obtained on the polyester film and a positive pattern on the photosensitive layer.

EXAMPLE 9

Japanese tissue paper (available from Mitsubishi Paper Mills, Ltd., Tokyo, Japan under the name of "Kyokuryu") was adhered onto the photosensitive layer with an acrylic ester emulsion (available from Chuo Rika Kogyo Kabushiki Kaisha, Tokyo, Japan under the name of "B52H") in an amount of 30 g/m$^2$ and dried at 60° C. for 3 minutes.

Letters were written by a typewriter on the Japanese tissue paper side and exposed to light with the machine employed in Example 1 for 30 seconds. Upon peeling off the photosensitive layer, a negative aluminum pattern of the typewritten letters was obtained on the polyester film.

EXAMPLE 10

A photosensitive composition was prepared by dissolving 20 g of polyvinyl alcohol (available from Toa Gosei Chemical Industry, Co., Ltd., Tokyo, Japan under the name of "NH-20") and 0.8 g of 4-(p-tolyl mercapto)-2,5-diethoxybenzene diazonium tetrafluoroborate in 180 g of water, the solid content being 10.36%.

Aluminum was deposited by vacuum evaporation in a thickness of 100 m$\mu$ on a biaxially oriented polypropylene film having a thickness of 75μ. The photosensitive composition was coated onto the aluminum layer and dried by hot air at 100° C. for one minute into a photosensitive layer having a thickness of 3μ.

A positive original was overlapped on the photosensitive layer and the assembly was exposed to light from a 2 KW xenon arc lamp at a distance of 100 cm for 3 minutes. The photosensitive layer was peeled off to obtain a negative aluminum pattern on the film and a positive pattern on the photosensitive layer.

EXAMPLE 11

On one side of a 50μ polyethylene terephthalate film pigmented with carbon black was deposited a 70 mμ aluminum layer by vacuum evaporation, and another side was coated with an acrylic pressure-sensitive adhesive available from Nippon Carbide Industries Co., Ltd., Tokyo, Japan under the name of "Nissetsu PE115A" in a thickness of 30μ and a release paper sheet was placed thereon.

A photosensitive composition prepared as in Example 1 was coated onto the aluminum layer by a wire bar and dried by hot air at 90° C. for one minute to obtain a 5μ photosensitive layer.

A negative original was overlapped on the element thus produced and the assembly was subjected to an exposure treatment according to the procedure in Example 1. After peeling off the photosensitive layer, a positive pattern in silver tint was obtained on the black film. The product could be attached to a desired place as a label after removing the release sheet.

EXAMPLE 12

A photosensitive composition containing 10.18% of solid was prepared by dissolving 10 g of polyvinyl butylal containing 3% of acetyl group, 65±3% of butyral group and 35±5% of hydroxy group and 0.2 g of 4-(p-tolyl mercapto)-2,5-diethoxybenzene diazonium zinc chloride in a mixture of 45 g of methyl ethyl ketone, 27 g of toluene and 18 g of cyclohexanone.

On a 100μ polyethylene terephthalate film was deposited by vacuum evaporation a 100 mμ aluminum layer to which the photosensitive composition was coated by a wire bar and dried at 90° C. for one minute to obtain a 5μ photosensitive layer.

With the machine used in Example 3 at a printing figure of 5, the element was exposed to light together with a positive original, followed by peeling off the photosensitive layer to obtain a negative aluminum pattern on the film. The product was suitable for use as a lithographic plate.

EXAMPLE 13

A photosensitive composition was prepared by dissolving 0.4 g of 1,2-diazonaphthol-5-sulfonic acid sodium salt in 50 g of polyvinyl chloride emulsion available from Nisshin Chemical Industries Co., Ltd., Tokyo, Japan under the name of "Vinyblane 320."

A 100μ polyethylene terephthalate film was deposite with aluminum in a thickness of 100μ by vacuum evaporation, followed by coating with the photosensitive composition and drying at 100° C. for 30 seconds to produce a photosensitive layer of 3μ thick.

A 12μ polyethylene terephthalate film was laminated on the photosensitive layer by means of a 30μ acrylic adhesive layer (available from Nippon Carbide Industries Co., Ltd. under the name of "Nissetsu PE115A") to obtain an image producing element.

According to the procedures in Example 1, the element was exposed to light, followed by peeling off the photosensitive layer to obtain a negative pattern on the film.

Since the photosensitive layer was reinforced by the laminated film and hence had improved mechanical strength, the peeling off operation was readily effected, the resulting element was suitable for use in a large size, and the positive pattern produced on the photosensitive layer was used for various purposes.

EXAMPLE 14

An image producing element produced by procedures similar to those of Example 6 was exposed to light using a positive original with the machine employed in Example 3 at a printing exposure of 10.

The exposed element was heated at 90° C. for 30 seconds and then the overall photosensitive surface was exposed to light again with the machine at a printing exposure of the dial figure being 10.

After 20 minutes from the second exposure, the photosensitive layer was peeled off to obtain a positive aluminum pattern on the substrate film and a negative pattern on the photosensitive layer.

What is claimed is:

1. A dry system image producing element capable of producing images when developed using a dry process which consists essentially of a substrate having a surface, a thin intermediate layer of a metal or metal compound covering said substrate surface and adherent thereto, and a photosensitive layer on top of said intermediate layer and adherent thereto,
    said photosensitive layer consisting essentially of a polymeric binding material, and a photosensitizer selected from the group consisting of benzophenone, quinone compounds, diazonium compounds and azido compounds,
    said intermediate layer having greater adhesion to the unexposed photosensitive layer than to said substrate,
    said intermediate layer having decreased adhesion to said photosensitive layer after said element has been exposed to light through a pattern in those portions of the element receiving light through said pattern so that the adhesion between said intermediate layer and the exposed portions of the photosensitive layer becomes less than the adhesion between said intermediate layer and said substrate,
    whereby after exposure, when said photosensitive layer and said substrate are peeled apart, the portions of said intermediate layer under the unexposed portions of said photosensitive layer are removed with said photosensitive layer, and the portions of said intermediate layer under the exposed portions of said photosensitive layer remain adherent on the substrate, forming an image of said pattern.

2. The element of claim 1, wherein said polymeric binding material is selected from the group consisting of polyvinyl chloride, vinyl chloride - vinyl acetate copolymer, vinyl chloride - vinylidene chloride copolymer, vinyl chloride - vinyl acetate-maleic anhydride terpolymer, acrylonitrile or vinyl alcohol terpolymer, vinyl chloride - vinylidene chloride - acrylonitrile terpolymer, vinyl acetate or methylacrylate terpolymer, acrylic ester - methyl methacrylate or styrene copolymer, thermoplastic polyester or copolyester, alcohol soluble polyamide, polyurethane , polybutyral, polyvinyl alcohol, acetylcellulose, acetylbutylcellulose, nitrocellulose, ethylcellulose, cyclicized rubber, rubber chloride.

3. The element of claim 2, wherein said intermediate layer is a metal layer.

4. The element of claim 3, wherein said metal is selected from the group consisting of aluminum, zinc, silver, gold, nickel, chromium, cobalt, iron, germanium, magnesium, manganese, platinum, tin, copper, palladium, nickel-cobalt, and nickel-phosphorus.

5. The element of claim 4, wherein said photosensitizer is a diazonium compound selected from the group consisting of 4-(p-tolyl mercapto)-2,5-diethoxybenzene diazonium zinc chloride, sodium sulfate or tetrafluoroborate, 4-(p-tolyl mercapto)-2,5-dimethoxybenzene diazonium zinc chloride, 4-(p-methyl benzoylamino)-2,5-diethoxybenzene diazonium zinc chloride, 4-(p-methoxybenzoylamino)-2,5-diethoxybenzene diazonium zinc chloride, 4-morpholino-2,5-butoxybenzene diazonium zinc chloride or tetrafluoroborate, 4-morpholino-benzene diazonium tetrafluoroborate, 4-pyrrolidino3-methyl-benzene tetrafluoroborate, p-N,N-dimethyl aminobenzene diazonium zinc chloride, p-N,N-diethyl aminobenzene diazonium zinc chloride or tetrafluoroborate, p-N-ethyl-N-hydroxy aminobenzene diazonium zinc chloride, 1,2-diazonaphthol-5-sulfonic acid sodium salt, or zinc chloride salt of a condensate of 4-diazodiphenylamine sulfuric acid and formaldehyde.

6. The element of claim 5, wherein said diazonium compound photosensitizer is 4-(p-tolyl mercapto)-2,5-diethoxybenzene diazonium zinc chloride.

7. The element of claim 5, wherein said diazonium compound photosensitizer is 4-(p-tolyl mercapto)-2,5-diethoxybenzene diazonium tetrafluoroborate.

8. The element of claim 5, wherein said diazonium compound photosensitizer is 4-(p-tolyl mercapto)-2,5-dimethoxybenzene diazonium zinc chloride.

9. The element of any one of claims 1, 6, 7 or 8, wherein said metal layer is aluminum.

10. The element of any one of claims 1, 6, 7 or 8, wherein said metal layer is copper.

11. The element of claim 1, wherein said intermediate layer is a metal compound selected from the group consisting of cadmium sulfide, magnesium fluoride and titanium dioxide.

12. A dry system image producing element according to claim 1, wherein said thin layer of a metal or a metal compound is a vacuum evaporated layer or an electroless plated layer or a combination of an electrolytic plated layer therewith.

13. A dry system image producing element according to claim 11, wherein said binding material is a film forming, water or organic solvent soluble synthetic resin, a cellulose derivative or a rubber derivative.

14. A dry system image producing element according to claim 1, wherein said quinone compound photosensitizer is 1,4-naphthoquinone, 2-methyl-1,4-naphthoquinone, anthraquinone, 2-methylanthraquinone, 2-ethylanthraquinone, 2-chloroanthraquinone or p-toluquinone.

15. A dry system image producing element according to claim 1, wherein said azido compound photosensitizer is 2,6-di(4'-azidobenzal) cyclohexanone.

16. A dry system image producing element according to claim 1, wherein said photosensitive layer contains a benzophenone or quinone compound photosensitizer and polyvinyl chloride, vinyl chloride/vinyl acetate copolymer, vinyl chloride/vinyl acetate/maleic anhydride, acrylonitrile or vinyl alcohol terpolymer, vinyl chloride/vinylidene chloride copolymer, vinyl chloride/vinylidene chloride/acrylonitrile terpolymer, nitrocellulose, acetylcellulose, acetyl-butylcellulose, ethylcellulose, cyclized rubber or rubber chloride.

17. A dry process for producing an image comprising passing light through a pattern onto a photographic element,
   said photographic element comprising a substrate having a surface, a thin intermediate layer of a metal or metal compound on said substrate surface and adherent thereto, and a photosensitive layer on top of said intermediate layer and adherent thereto,
   said photosensitive layer consisting essentially of a polymeric binding material, and a photosensitizer selected from the group consisting of benzophenone, quinone compounds, diazonium compounds and azido compounds,
   said intermediate layer having greater adhesion to the unexposed photosensitive layer than to said substrate,
   said intermediate layer having decreased adhesion to said photosensitive layer after said element has been exposed to light through a pattern in those portions of the element receiving light through said pattern so that the adhesion between said intermediate layer and the exposed portions of the photosensitive layer becomes less than the adhesion between said intermediate layer and said substrate, and
   then peeling off said photosensitive layer from said substrate, whereby the portions of said intermediate layer under the unexposed portions of said photosensitive layer are removed with said photosensitive layer, and the portions of said intermediate layer under the exposed portions of said photosensitive layer remain adherent to the substrate and form an image corresponding to said exposed portion.

18. A dry process for producing an image comprising passing light through a pattern onto a photographic element,
   said photographic element comprising a substrate having a surface, a thin intermediate layer of a metal or metal compound on said substrate surface and adherent thereto, and a photosensitive layer on top of said intermediate layer and adherent thereto,
   said photosensitive layer consisting essentially of a polymeric binding material, and a photosensitizer selected from the group consisting of benzophenone, quinone compounds, diazonium compounds and azido compounds,
   said intermediate layer having greater adhesion to the unexposed photosensitive layer than to said substrate,
   said intermediate layer having decreased adhesion to said photosensitive layer after said element has been exposed to light through a pattern in those portions of the element receiving light through said pattern so that the adhesion between said intermediate layer and the exposed portions of the photosensitive layer becomes less than the adhesion between said intermediate layer and said substrate,
   heating said photographic element,
   exposing the entire surface of said photosensitive layer to light, and then peeling off said photosensitive layer from said substrate, whereby the portions of said intermediate layer under the exposed portions of said photosensitive layer are removed with said photosensitive layer, and the portions of said intermediate layer under the non-exposed portions of said photosensitive layer remain adherent to the substrate and form an image corresponding to said initially non-exposed portion.

* * * * *